United States Patent
Gauchi et al.

(10) Patent No.: US 12,300,347 B2
(45) Date of Patent: May 13, 2025

(54) RECONFIGURABLE MEMORY MODULE DESIGNED TO IMPLEMENT COMPUTING OPERATIONS

(71) Applicants: Commissariat à l'Energie Atomique et aux Energies Alternatives, Paris (FR); The Board of Trustees of the Leland Stanford Junior University, Standford, CA (US)

(72) Inventors: Roman Gauchi, Grenoble (FR); Pascal Vivet, Grenoble (FR); Subhasish Mitra, Menlo Park, CA (US); Henri-Pierre Charles, Grenoble (FR)

(73) Assignees: COMMISSARIAT À L'ENERGIE ATOMIQUE ET AUX ENERGIES ALTERNATIVES, Paris (FR); THE BOARD OF TRUSTEES OF THE LELAND STANFORD JUNIOR UNIVERSITY, Stanford, CA (US)

( * ) Notice: Subject to any disclaimer, the term of this patent is extended or adjusted under 35 U.S.C. 154(b) by 292 days.

(21) Appl. No.: 18/040,246

(22) PCT Filed: Jul. 30, 2021

(86) PCT No.: PCT/EP2021/071387
§ 371 (c)(1),
(2) Date: Feb. 1, 2023

(87) PCT Pub. No.: WO2022/029026
PCT Pub. Date: Feb. 10, 2022

(65) Prior Publication Data
US 2023/0352066 A1   Nov. 2, 2023

(30) Foreign Application Priority Data
Aug. 4, 2020 (FR) ...................... 2008272

(51) Int. Cl.
*G11C 11/00* (2006.01)
*G11C 7/10* (2006.01)
*G11C 7/24* (2006.01)

(52) U.S. Cl.
CPC .......... *G11C 7/1048* (2013.01); *G11C 7/1075* (2013.01); *G11C 7/24* (2013.01)

(58) Field of Classification Search
CPC ....... G11C 7/1048; G11C 7/1075; G11C 7/24; G11C 7/1006
See application file for complete search history.

(56) References Cited

U.S. PATENT DOCUMENTS

2003/0107942 A1* 6/2003 Perner ...................... G11C 7/24
                                                              365/230.03
2005/0047255 A1* 3/2005 Park ...................... G11C 7/1075
                                                              365/230.05
(Continued)

FOREIGN PATENT DOCUMENTS

EP     3252774 A1    12/2017
EP     3503103 A1     6/2019
(Continued)

OTHER PUBLICATIONS

International Search Report for International Application No. PCT/EP2021/071387 dated Oct. 26, 2021, 3 pages.
(Continued)

*Primary Examiner* — Hien N Nguyen
(74) *Attorney, Agent, or Firm* — Jordan IP Law, LLC

(57) ABSTRACT

The present description concerns a memory module (100) adapted to implementing computing operations, the module comprising a plurality of elementary blocks (110) arranged in an array according to rows and columns, wherein: each elementary block (110) comprises a memory circuit (111) adapted to implementing computing operations, and a configurable transfer circuit (113); each configurable transfer (Continued)

circuit (113) is parameterizable to transmit data originating from a first transmit elementary block to a receive elementary block of a same column of elementary blocks via at least one link bus; an internal control circuit (120) is connected to an input-output port (123) of the module; and the internal control circuit (120) is configured to read at least one instruction signal from the input-output port (123) of the module and accordingly parameterize the configuration of the configurable transfer circuits (113), and define the size of the operand vectors of the computing operations.

18 Claims, 6 Drawing Sheets

(56) References Cited

U.S. PATENT DOCUMENTS

| | | | | |
|---|---|---|---|---|
| 2007/0226382 | A1* | 9/2007 | Chiu | G06F 13/28 710/22 |
| 2023/0205710 | A1* | 6/2023 | Mambu | G06F 15/7821 710/308 |
| 2023/0205901 | A1* | 6/2023 | Charles | G11C 7/1006 726/26 |

FOREIGN PATENT DOCUMENTS

| | | |
|---|---|---|
| EP | 3660849 A1 | 6/2020 |
| FR | 3075444 A1 | 6/2019 |
| WO | 2011023502 A1 | 3/2011 |

OTHER PUBLICATIONS

Lu, Guangming, Hartej Singh, Ming-Hau Lee, Nader Bagherzadeh, Fadi J. Kurdahi, and V. Castro-Alves. "The MorphoSys dynamically reconfigurable system-on-chip." In Proceedings of the First NASA/DoD Workshop on Evolvable Hardware, pp. 152-160. IEEE, 1999.

Akyel, Kaya Can, Henri-Pierre Charles, Julien Mottin, Bastien Giraud, Grégory Suraci, Sébastien Thuries, and Jean-Philippe Noel. "DRC 2: Dynamically Reconfigurable Computing Circuit based on memory architecture." In 2016 IEEE International Conference on Rebooting Computing (ICRC), pp. 1-8. IEEE, 2016.

Multi layer AHB Technical Overview v2.0 (2004). Available at: https://developer.arm.com/docs/dvi0045/b/multi-layer-ahb-technical-overview-v20 (Accessed: Feb. 1, 2023).

AMBA 3 AHB Lite Protocol Specification v1.0 (2010). Available at: https://developer.arm.com/docs/ihi0033/a/amba-3-ahb-lite-protocol-specification-v10 (Accessed: Feb. 1, 2023).

Eckert, Charles, Xiaowei Wang, Jingcheng Wang, Arun Subramaniyan, Ravi Iyer, Dennis Sylvester, David Blaaauw, and Reetuparna Das. "Neural cache: Bit-serial in-cache acceleration of deep neural networks." In 2018 ACM/IEEE 45Th annual international symposium on computer architecture (ISCA), pp. 383-396. IEEE, 2018.

Faro, Simone, and Thierry Lecroq. "The exact online string matching problem: A review of the most recent results." ACM Computing Surveys (CSUR) 45, No. 2 (2013): 1-42.

Gauchi, Roman, Maha Kooli, Pascal Vivet, J-P. Noel, Edith Beigne, Subhasish Mitra, and H-P. Charles. "Memory sizing of a scalable SRAM in-memory computing tile based architecture." In 2019 IFIP/IEEE 27th International Conference on Very Large Scale Integration (VLSI-SoC), pp. 166-171. IEEE, 2019.

Wang, Jingcheng, Xiaowei Wang, Charles Eckert, Arun Subramaniyan, Reetuparna Das, David Blaauw, and Dennis Sylvester. "14.2 A compute SRAM with bit-serial integer/floating-point operations for programmable in-memory vector acceleration." In 2019 IEEE International Solid-State Circuits Conference-(ISSCC), pp. 224-226. IEEE, 2019.

Kooli, Maha, Henri-Pierre Charles, Clement Touzet, Bastien Giraud, and Jean-Philippe Noel. "Smart instruction codes for in-memory computing architectures compatible with standard SRAM interfaces." In 2018 Design, Automation & Test in Europe Conference & Exhibition (DATE), pp. 1634-1639. IEEE, 2018.

Noel, J-P., Valentin Egloff, Maha Kooli, Roman Gauchi, J-M. Portal, H-P. Charles, Pascal Vivet, and Bastien Giraud. "Computational SRAM design automation using pushed-rule bitcells for energy-efficient vector processing." In 2020 Design, Automation & Test in Europe Conference & Exhibition (DATE), pp. 1187-1192. IEEE, 2020.

Simon, William Andrew, Yasir Mahmood Qureshi, Alexandre Levisse, Marina Zapater, and David Atienza. "Blade: A bitline accelerator for devices on the edge." In Proceedings of the 2019 on Great Lakes Symposium on VLSI, pp. 207-212. 2019.

Singh, Gagandeep, Lorenzo Chelini, Stefano Corda, Ahsan Javed Awan, Sander Stuijk, Roel Jordans, Henk Corporaal, and Albert-Jan Boonstra. "A review of near-memory computing architectures: Opportunities and challenges." In 2018 21st Euromicro Conference on Digital System Design (DSD), pp. 608-617. IEEE, 2018.

Stephens, Nigel, Stuart Biles, Matthias Boettcher, Jacob Eapen, Mbou Eyole, Giacomo Gabrielli, Matt Horsnell et al. "The ARM scalable vector extension." IEEE micro 37, No. 2 (2017): 26-39.

RI5CY: User Manual (2019). Available at: https://www.pulp-platform.org/docs/ri5cy_user_manual.pdf (Accessed: Feb. 1, 2023).

Translation of the International Preliminary Report on Patentability for International Patent App. No. PCT/EP2021/071387 dated Oct. 24, 2022, 7 pages.

Agrawal, Amogh, Akhilesh Jaiswal, Chankyu Lee, and Kaushik Roy. "X-SRAM: Enabling in-memory Boolean computations in CMOS static random access memories." IEEE Transactions on Circuits and Systems I: Regular Papers 65, No. 12 (2018): 4219-4232.

\* cited by examiner

RECONFIGURABLE MEMORY MODULE DESIGNED TO IMPLEMENT COMPUTING OPERATIONS

FIELD

The present disclosure generally concerns the field of memory circuits, and more particularly targets the field of memory circuits adapted to implementing computing operations.

BACKGROUND

Memory circuits adapted to implementing computing operations have already been provided. Such circuits are for example intended to cooperate with a microprocessor, to discharge the microprocessor of certain computing tasks.

It would be desirable to be able to extend the functionalities of known architectures of memory circuits adapted to implementing computing operations.

SUMMARY

For this purpose, an embodiment provides a memory module adapted to implementing computing operations, the module comprising a plurality of elementary blocks arranged in an array according to rows and columns, wherein:
  each elementary block comprises a memory circuit adapted to implementing computing operations, and a configurable transfer circuit;
  in each column of the array, the configurable transfer circuits of the elementary blocks in the column are coupled by at least one link bus;
  each configurable transfer circuit is parameterizable to transmit data originating from a first transmit elementary block to a receive elementary block of a same column of elementary blocks via said at least one link bus;
an internal control circuit (120) is connected to an input-output port (123) of the module comprising a data input port (WDATA), a data output port (RDATA), and an address input port (ADDR), the input-output port of the module (123) being intended to be connected to an external device; and
the internal control circuit (120) is configured to read at least one instruction signal from the input-output port (123) of the module and accordingly parameterize the configuration of the configurable transfer circuits (113), at least one instruction signal enabling to define the size of the operand vectors of the computing operations implemented by the memory module.

According to an embodiment, the memory module further comprises a configuration register (CSR) storing information relative to the current size of the operand vectors, the configuration register being updated after reception of a size configuration instruction signal originating from said external device.

According to an embodiment, the memory module is such that at least one instruction signal capable of being received on the input-output port of the memory module codes an operation to be performed between 2 operands stored in different memory circuits respectively belonging to at least one first elementary block and at least one second elementary block, and for which the execution of the operation comprises an operation of transfer of one of the operands from said at least one first elementary block to said at least one second elementary block via configurable transfer circuits (113) of said at least one first and at least one second elementary blocks and said at least one link bus.

According to an embodiment, the memory module comprises a plurality of elementary blocks arranged in an array of K rows and P columns, with P an integer greater than or equal to 1, and K an integer greater than 1, and wherein the size of the operand vectors may take a plurality of different values, including at least one first size smaller than a second size, and wherein, when the first size is applied, an operand is stored in the memory circuits of a single row of elementary blocks and wherein when the second size is applied an operand is stored in the memory circuits of a plurality of rows of elementary blocks, each memory circuit comprising a portion of the operand of second size and wherein a single vector size is applied at a given time and defined by the configuration register.

According to an embodiment, when the second size is applied, a first operand is stored in a plurality of first elementary blocks belonging to different rows and a second operand is stored in a plurality of second elementary blocks belonging to different rows, and wherein the operation of transfer of the first operand comprises a plurality of independent operations of transfer from a first elementary block to a second elementary block.

According to an embodiment, when the second size is applied, the array of elementary blocks is organized in a plurality of groups of rows, each group of rows being used to store a same portion of a given operand, and wherein data transfers between two elementary blocks of a same column are possible only within a same group of rows.

According to an embodiment:
  in each column of the array, the configurable transfer circuits of the elementary blocks in the column are coupled by uplink and downlink buses; and
  each configurable transfer circuit is controllable to transmit data between two uplink buses, between two downlink buses, and/or between the memory circuit of the corresponding elementary block and the two uplink buses and/or the two downlink buses.

According to an embodiment:
  in each column of the array, the configurable transfer circuits of any two adjacent elementary blocks of the column are coupled two by two by an uplink bus and by a downlink bus;
  in each elementary block of each column of the array, except for the elementary blocks of the first and last rows of the array, the configurable transfer circuit of the elementary block is controllable to:
    a) transmit to a first data input port of the memory circuit of the elementary block one or the other of:
      a data word received over the downlink bus coupling the elementary block to the adjacent elementary block of lower rank in the column; and
      a data word received over the uplink bus coupling the elementary block to the adjacent elementary block of higher rank in the column;
    b) transmit over the uplink bus coupling the elementary block to the adjacent elementary block of lower rank in the column one or the other of:
      a data word received on a first data output port of the memory circuit of the elementary block; and
      a data word received over the uplink bus coupling the elementary block to the adjacent elementary block of higher rank in the column; and c) transmit over the downlink bus coupling the elementary block to the adjacent elementary block of higher rank in the column one or the other of:
   a data word received on the first data output port of the memory circuit of the elementary block; and
   a data word received over the downlink bus coupling the elementary block to the adjacent elementary block of lower rank in the column.

According to an embodiment, the transfer circuits of the different elementary blocks of the array are connected to the internal control circuit of the memory module via a control bus.

According to an embodiment, the memory circuits of the different elementary blocks of the array are connected to the internal control circuit via a distribution bus.

According to an embodiment, each memory circuit comprises a second data input port and a second data output port connected to the distribution bus.

According to an embodiment, the width of the second data input port and the width of the second data output port are respectively smaller than or equal to the width of the first data input port and the width of the first data output port.

According to an embodiment, the width of the second data input port and the width of the second data output port are respectively smaller than the width of the first data input port and than the width of the first data output port.

According to an embodiment, each memory circuit further comprises an address input port connected to the distribution bus.

According to an embodiment, the memory module further comprises a general access regulation circuit, connected to the internal control circuit, the general access regulation circuit performing a tracking of the instructions received on the input-output port of the module and asking if necessary the internal control circuit to wait before requiring the execution of an instruction by an elementary block or before performing a data transfer between a plurality of elementary blocks via said at least one link bus.

According to an embodiment, in each elementary block, the transfer circuit of the block comprises first, second, and third multiplexers each having first and second input ports and an output port and wherein:
   the first multiplexer has its first and second input ports respectively connected to the downlink bus coupling the elementary block to the adjacent elementary block of lower rank in the column and to the uplink bus coupling the elementary block to the adjacent elementary block of higher rank in the column, and its output port connected to the first data input port of the memory circuit of the elementary block;
   the second multiplexer has its first and second input ports respectively connected to the first data output port of the memory circuit of the elementary block and to the uplink block coupling the elementary block to the adjacent elementary block of higher rank in the column, and its output port connected to the uplink bus coupling the elementary block to the adjacent elementary block of lower rank in the column; and
   the third multiplexer has its first and second input ports respectively connected to the first data output port of the memory circuit of the elementary block and to the downlink bus coupling the elementary block to the adjacent elementary block of lower rank in the column, and its output port connected to the downlink bus coupling the elementary block to the adjacent elementary block of higher rank in the column.

According to an embodiment, said instruction is transmitted via the data input port and the address input port of the input-output port of the memory module.

An embodiment provides a system comprising a memory module according to an above-mentioned embodiment and a processing unit coupled to the memory module via the input-output port of the memory module, the memory module being coupled to a bus and behaving as a slave component over said bus.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of the different elements of the described memory modules has not been detailed, the forming of these elements being within the abilities of those skilled in the art based on the indications of the present disclosure. In particular, the forming of the memory circuits adapted to implementing computing operations has not been detailed.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

Unless specified otherwise, the expressions "around", "approximately", "substantially" and "in the order of" signify within 10%, and preferably within 5%.

Figure 1:
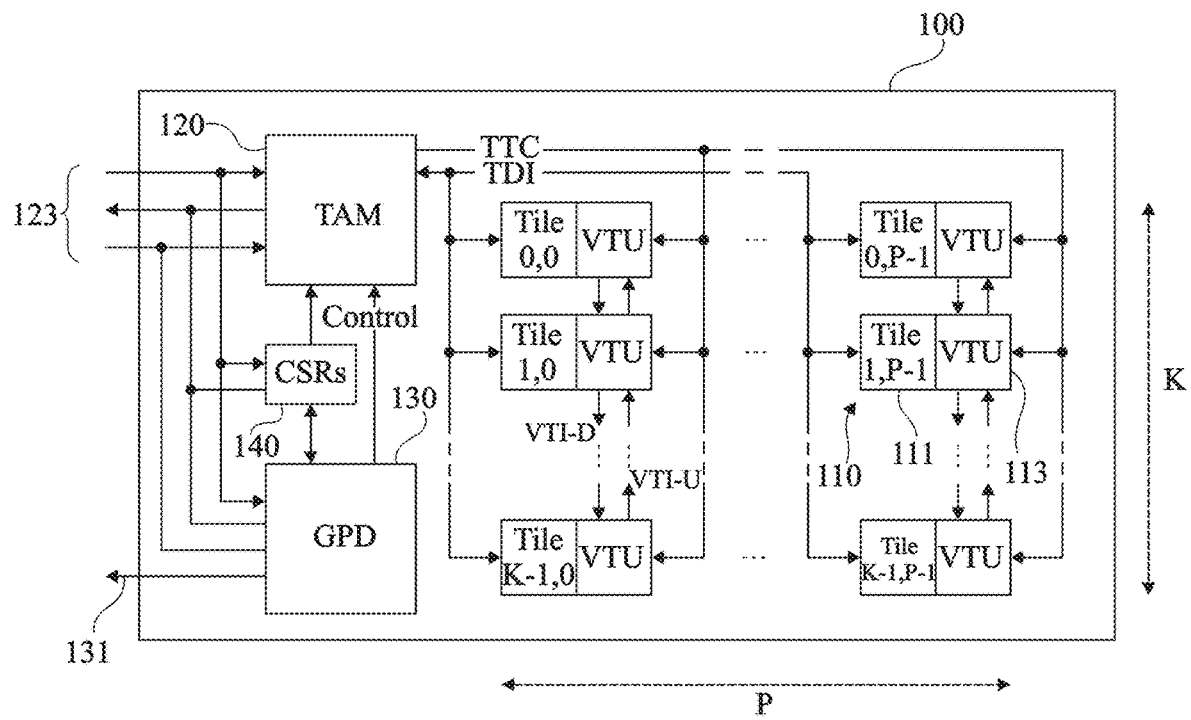
FIG. 1 schematically shows an example of an embodiment of a memory module adapted to implementing computing operations.

FIG. 1 schematically shows an example of an embodiment of a memory module 100 adapted to implementing computing operations.

Module 100 comprises a plurality of elementary blocks 110 arranged in an array of K rows and P columns, with P an integer greater than or equal to 1, preferably greater than or equal to 2, for example, greater than or equal to 3, and K an integer greater than or equal to 1, preferably greater than or equal to 3.

Each elementary block 110 comprises a memory circuit 111, also designated with reference "Tile i,j", i being an integer in the range from 0 to K 1 (Tile 0,0; Tile 1,0; Tile K 1,0) and j an integer in the range from 0 to P 1 (Tile 0,P 1; Tile 1,P 1; Tile K 1,P 1) respectively designating the position of the row and the position of the column of the elementary block in the array. Each memory circuit 111 is adapted to implementing computing functions. More particularly, each memory circuit 111 is adapted to loading and storing data, and to implementing a number of logic and/or arithmetical operations having as operands the data stored in memory circuit 111. Each elementary block 110 further comprises a vertical transfer circuit 113, also designated with reference VTU, coupled to the memory circuit 111 of the block.

In each column of the array, the configurable transfer circuits 113 of any two adjacent elementary blocks 110 of the column are coupled two by two by an uplink bus VTI-U and by a downlink bus VTI-D. In other words, in each column of the array, in each elementary block 110 of rank i of the column except for the elementary blocks of the first (i=0) and last (i=K−1) rows of the array, the vertical transfer circuit 113 of the block is coupled, for example, connected, to the vertical transfer circuit 113 of the elementary block 110 of rank i−1 by an uplink bus VTI-U and by a downlink bus VTI-D and is coupled, for example connected, to the vertical transfer circuit 113 of the elementary block 110 of rank i+1 by another uplink bus VTI-U and by another downlink bus VTI-D.

In each column, the vertical transfer circuit 113 of the elementary block 110 of rank i=0 is coupled, for example, connected, to the vertical transfer circuit 113 of the elementary block 110 of rank i=1 by an uplink bus VTI-U and by a downlink bus VTI-D. Further, in each column, the vertical transfer circuit 113 of the elementary block 110 of rank i=K−1 is coupled, for example, connected, to the vertical transfer circuit 113 of the elementary block 110 of rank i=K−2 by an uplink bus VTI-U and by a downlink bus VTI-D.

According to an aspect of the described embodiments, in each column of the array, in each elementary block 110 of rank i of the column, except for the elementary blocks 110 of the first (i=0) and last (i=K−1) rows of the array, the vertical transfer circuit 113 of the block is configurable to:

a) transmit over a data writing bus (not detailed in FIG. 1) of the memory circuit 111 of the block one or the other of:
   a data word received over the downlink bus VTI-D coupling the vertical transfer circuit 113 of elementary block 110 to the vertical transfer circuit 113 of the adjacent elementary block 110 of rank i−1 in the column; and
   a data word received over the uplink bus VTI-U coupling the vertical transfer circuit 113 of elementary block 110 to the vertical transfer circuit 113 of the adjacent elementary block 110 of rank i+1 in the column;

b) transmit over the uplink bus VTI-U coupling the vertical transfer circuit 113 of elementary block 110 to the vertical transfer circuit 113 of the adjacent elementary block 110 of rank i−1 in the column one or the other of:
   a data word received over a data reading bus (not detailed in FIG. 1) of the memory circuit 111 of the elementary block; and
   a data word received over the uplink bus VTI-U coupling the vertical transfer circuit 113 of elementary block 110 to the vertical transfer circuit 113 of the adjacent elementary block 110 of rank i+1 in the column; and c) transmit over the downlink bus VTI-D coupling the vertical transfer circuit 113 of elementary block 110 to the vertical transfer circuit 113 of the adjacent elementary block of rank i+1 in the column one or the other of:
   a data word received over the data reading bus of the memory circuit 111 of the elementary block; and
   a data word received over the downlink bus VTI-D coupling the vertical transfer circuit 113 of elementary block 110 to the vertical transfer circuit 113 of the adjacent elementary block 110 of rank i−1 in the column.

In each column, the vertical transfer circuit 113 of the elementary block 110 of rank i=0 is for example adapted to:
   transmitting a data word received over the data reading bus of the memory circuit 111 of block 110 to the downlink bus VTI-D coupling block 110 to the vertical transfer circuit 113 of the adjacent elementary block 110 of rank i=1; and/or
   transmitting over the data writing bus of the memory circuit 111 of block 110 a data word received over the uplink bus VTI-U coupling block 110 to the vertical transfer circuit 113 of the adjacent elementary block 110 of rank i=1.

In each column, the vertical transfer circuit 113 of the elementary block 110 of rank i=K−1 is for example adapted to:
   transmitting a data word received over the data reading bus of the memory circuit 111 of block 110 to the uplink bus VTI-U coupling block 110 to the vertical transfer circuit 113 of the adjacent elementary block 110 of rank i=K−2; and/or
   transmitting over the data writing bus of the memory circuit 111 of block 510 a data word received over the downlink bus VTI-D coupling block 110 to the vertical transfer circuit 113 of the adjacent elementary block 110 of rank i=K−2.

The memory module 100 of FIG. 1 further comprises an internal circuit 120 for controlling elementary blocks 110, also designated with reference TAM in FIG. 1, coupled, for example connected, to an input-output port 123 of the module. Port 123 is intended to be coupled, for example connected, to a device external to the module, for example a microprocessor. Port 123 is adapted to receiving address signals, data signals, and/or control signals supplied by the external device. Port 123 is further adapted to supplying data signals to the external device.

Circuit 120 is particularly adapted to controlling the configuration of the vertical transfer circuits 113 of the elementary blocks 110 of the memory module. For this purpose, a control bus TTC internal to module 100 couples circuit 120 to control input ports (not detailed in FIG. 1) of the vertical transfer circuits 113 of the different elementary blocks 110 of the memory module.

Circuit 120 is further adapted to controlling the reading and the writing of data, as well as the implementation of computing operations, in the memory circuits 111 of the elementary blocks 110 of the memory module. For this purpose, a distribution bus TDI internal to unit 100 couples circuit 120 to data input-output, address, and control ports (not detailed in the drawing) of the memory circuits 111 of the different elementary blocks 110 of the memory module.

Module 100 further comprises a general access regulation circuit 130, also referred to as GPD in FIG. 1, as well as a configuration register circuit 140, also referred to as CSRs in FIG. 1.

Circuit 130 is adapted to sequencing the accesses to the elementary blocks 110 of the memory circuit, to avoid address conflicts during the execution of the instructions received from the outside of the module, via port 123. For this purpose, circuit 130 is coupled, for example connected, to port 123. It receives all the instructions originating from the outside of the module, and is adapted to inserting one or a plurality of waiting cycles between different steps of a same instruction when a potential conflict is detected. For this purpose, circuit 130 is adapted to sending control data to circuit 120, via a control bus designated with reference Control in FIG. 1. Circuit 130 is further adapted to sending control data onto an output port 131 of the module, intended to be connected to the external device.

Circuit 140 is adapted to storing configuration data used by circuit 120 to configure vertical transfer circuits 113. Circuit 140 is also coupled, for example connected, to the input-output port 123 of the module. Circuit 120 is adapted to reading data from register circuit 140. Circuit 130 is adapted to reading and writing data from and into register circuit 140.

Figure 2:
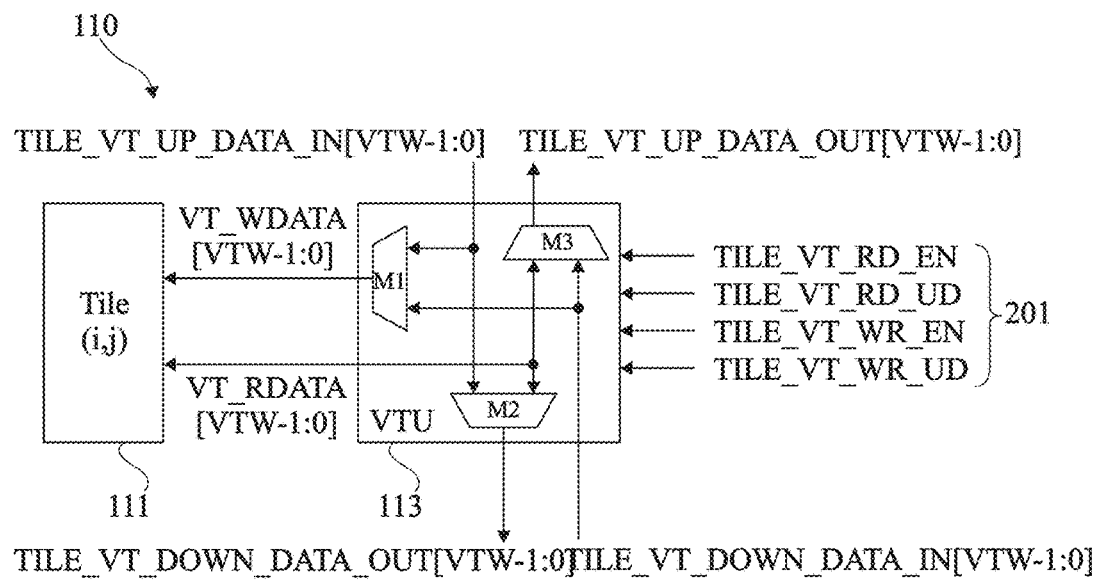
FIG. 2 shows an example of embodiment of a vertical transfer circuit of an elementary block of the memory module of FIG. 1.

FIG. 2 shows in further detail an example of embodiment of an elementary block 110 of the memory module of FIG. 1. More particularly, FIG. 2 illustrates in further detail an example of embodiment of the vertical transfer circuit 113 (VTU) of block 110.

In this example, circuit 113 is formed based on multiplexers. More particularly, in this example, circuit 113 comprises three multiplexers M1, M2, and M3 each having two input ports and one output port. Each multiplexer is adapted to connecting one or the other of its two input ports to its output port, according to a control signal applied to a control terminal (not detailed in FIG. 2) of the multiplexer.

Multiplexer M1 has a first input port coupled, for example connected, to the input port TILE_VT_UP_DATA_IN of circuit 113, of width (number of bits transmitted in parallel) VTW, VTW being an integer greater than or equal to 2, and a second input port coupled, for example connected, to an input port TILE_VT_DOWN_DATA_IN of same width VTW of circuit 113. Input port TILE_VT_UP_DATA_IN is coupled, for example connected, to the downlink bus VTI-D coupling block 110 to the adjacent block 110 of previous rank in the column. Input port TILE_VT_DOWN_DATA_IN is coupled, for example connected, to the uplink bus VTI-U coupling block 110 to the adjacent block 110 of next rank in the column. The output of multiplexer M1 is coupled, for example connected, to a data input port VT_W-DATA of width VTW of the memory circuit 111 of block 110.

Multiplexer M2 has a first input port coupled, for example connected, to input port TILE_VT_UP_DATA_IN and a second input port coupled, for example connected, to a data output port VT_RDATA of width VTW of the memory circuit 111 of block 110. The output of multiplexer M2 is coupled, for example connected, to an output port TILE_VT_DOWN_DATA_OUT of width VTW of circuit 113. Port TILE_VT_DOWN_DATA_OUT is coupled, for example connected, to the downlink bus VTI-D coupling block 110 to the adjacent block 110 of next rank in the column.

Multiplexer M3 has a first input port coupled, for example, connected, to the data output port VT_RDATA of the memory circuit 111 of block 110, and a second input port coupled, for example, connected, to the input port TILE_VT_DOWN_DATA_IN of circuit 113. The output of multiplexer M3 is coupled, for example connected, to an output port TILE_VT_UP_DATA_OUT of width VTW of circuit 113. Port TILE_VT_UP_DATA_OUT is coupled, for example connected, to the upward transfer bus VTI U coupling block 110 to the adjacent block 110 of previous rank in the column.

Multiplexers M1, M2, M3 are controlled according to control signals transmitted via control bus TTC on a control input port 201 of circuit 113. More particularly, in the shown example, each circuit 113 receives on its control input port 201 four binary logic signals TILE_VT_RD_EN, TILE_VT_RD_UP, TILE_VT_WR_EN, and TILE_VT_RD_UD. The following table sums up, as a non-limiting example, different possible configurations of circuit 113 according to the state of signals TILE_VT_RD_EN, TILE_VT_RD_UD, TILE_VT_WR_EN, and TILE_VT_WR_UD. Symbols 0, 1, and X respectively designate a low logic state, a high logic state, and an undetermined state (indifferently low or high) of the signals.

TABLE 1

| TILE_VT_WR_EN | TILE_VT_RD_EN | TILE_VT_WR_UD | TILE_VT_RD_UD | Configuration |
|---|---|---|---|---|
| 0 | 0 | X | X | a) |
| 0 | 1 | X | 0 | b) |
| 0 | 1 | X | 1 | c) |
| 1 | 0 | 0 | X | d) |
| 1 | 0 | 1 | X | e) |
| 1 | 1 | 0 | 0 | f) |
| 1 | 1 | 0 | 1 | g) |
| 1 | 1 | 1 | 0 | h) |
| 1 | 1 | 1 | 1 | i) |

In configuration a), data are vertically transmitted by circuit 113 from top to bottom over the downward transfer bus VTI D and/or from bottom to top over the upward transfer bus VTI U, with no interaction with memory circuit 111.

In configuration b), data are read from downward transfer bus VTI D via the input port TILE_VT_UP_DATA_IN of circuit 113 and written into memory circuit 111 via the data input bus VT_WDATA of circuit 111.

In configuration c), data are read from upward transfer bus VTI U via the input port TILE_VT_DOWN_DATA_IN of circuit 113 and written into memory circuit 111 via the data input bus VT_WDATA of circuit 111.

In configuration d), data are read from memory circuit 111 via the data output bus VT_RDATA of circuit 111, and written on downward transfer bus VTI D via the output port TILE_VT_DOWN_DATA_OUT of circuit 113.

In configuration e), data are read from memory circuit 111 via the data output bus VT_RDATA of circuit 111, and written onto upward transfer bus VTI U via the output port TILE_VT_UP_DATA_OUT of circuit 113.

In configuration f), data are read from downward transfer bus VTI D via the input port TILE_VT_UP_DATA_IN of circuit 113 and written into memory circuit 111 via the data input bus VT_WDATA of circuit 111, and data are read from memory circuit 111 via the data output bus VT_RDATA of circuit 111, and written onto downward transfer bus VTI D via the output port TILE_VT_DOWN_DATA_OUT of circuit 113.

In configuration g), data are read from upward transfer bus VTI U via the input port TILE_VT_DOWN_DATA_IN of circuit 113 and written into memory circuit 111 via the data input bus VT_WDATA of circuit 111, and data are read from memory circuit 111 via the data output bus VT_RDATA of circuit 111, and written onto downward transfer bus VTI D via the output port TILE_VT_DOWN_DATA_OUT of circuit 113.

In configuration h), data are read from downward transfer bus VTI D via the input port TILE_VT_UP_DATA_IN of circuit 113 and written into memory circuit 111 via the data input bus VT_WDATA of circuit 111, and data are read from memory circuit 111 via the data output bus VT_RDATA of circuit 111, and written onto upward transfer bus VTI U via the output port TILE_VT_UP_DATA_OUT of circuit 113.

In configuration i), data are read from upward transfer bus VTI U via the input port TILE_VT_DOWN_DATA_IN of circuit 113 and written into memory circuit 111 via the data input bus VT_WDATA of circuit 111, and data are read from memory circuit 111 via the data output bus VT_RDATA of circuit 111, and written onto upward transfer bus VTI U via the output port TILE_VT_UP_DATA_OUT of circuit 113.

The transfer circuits 113 of the blocks 110 of the first (i=0) and last (i=K-1) rows of the array may possibly be simplified. As an example, in the first and last rows of the array, multiplexers M1, M2, and M3 may be omitted. More particularly, in each circuit 113 of the first row of the array, input port TILE_VT_UP_DATA_IN and output port TILE_VT_UP_DATA_OUT may be omitted, and input TILE_VT_DOWN_DATA_IN and output TILE_VT_DOWN_DATA_OUT ports may be directly coupled, for example connected, respectively to the data input port VT_WDATA and to the data output port VT_RDATA of the memory circuit 111 of the corresponding block 110. Similarly, in each circuit 113 of the last row of the array, input port TILE_VT_DOW_DATA_IN and output port TILE_VT_DOWN_DATA_OUT may be omitted, and input TILE_VT_UP_DATA_IN and output TILE_VT_UP_DATA_OUT ports may be directly coupled, for example connected, respectively to the data input port VT_WDATA and to the data output port VT_RDATA of the memory circuit 111 of the corresponding block 110.

As a variant, in at least one of the first (i=0) and last (i=K-1) rows of the array, transfer circuits 113 have the same functionalities as in the other rows, to allow data transfers to and from a routing circuit (not detailed) arranged at the column foot or head, for example to perform horizontal data transfers (from one column to another) in the array.

Figure 3:
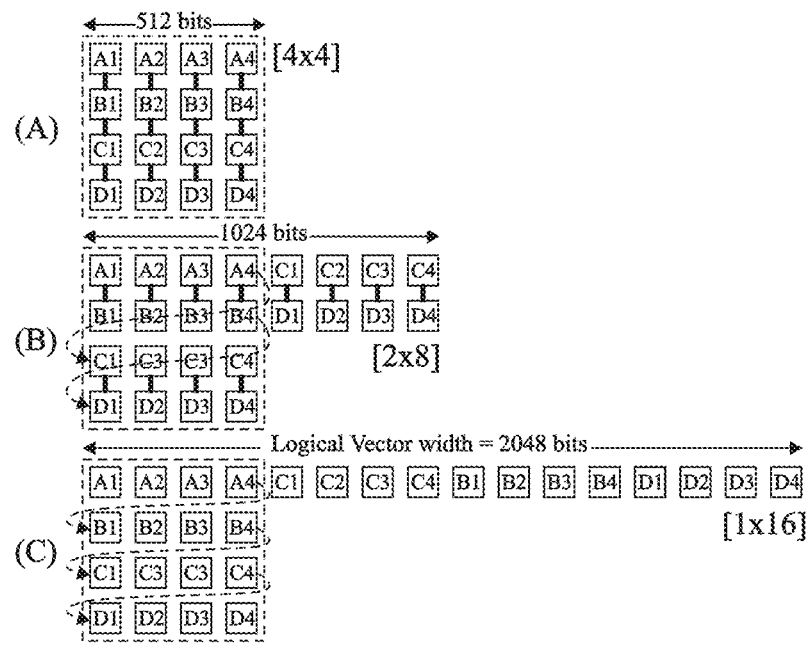
FIG. 3 illustrates examples of operating configurations of the memory module of FIG. 1.

FIG. 3 illustrates possible example of operating configuration of the memory module 100 of FIG. 1.

There is here considered, as an illustrative example, an array of K=4 rows and P=4 columns of elementary blocks 110.

In FIG. 3, for more clarity, there have been designated with A1, A2, A3, and A4 the elementary blocks 110 of the row of rank i=0 and respectively of the columns of ranks j=0, j=1, j=2, and j=3, with B1, B2, B3, and B4 the elementary blocks 110 of the row of rank i=1 and respectively of the columns of ranks j=0, j=1, j=2, and j=3, with C1, C2, C3, and C4 the elementary blocks 110 of the row of rank i=2 and respectively of the columns of ranks j=0, j=1, j=2, and j=3, and with D1, D2, D3, and D4 the elementary blocks 110 of the row of rank i=3 and respectively of the columns of ranks j=0, j=1, j=2, and j=3.

The frame in dashed line in FIG. 3 represents the physical location of the elementary blocks 110 of memory module 100.

As illustrated in FIG. 3, an advantage of the memory module 100 of FIG. 1 is that one can easily, via control circuit 120 and vertical transfer circuits 113, virtually reconfigure the array of elementary blocks 110 to extend the maximum dimension of the horizontal vectors capable of being processed by the memory module, particularly for the implementation of computing operations.

In FIG. 3, there has been shown by a horizontal bidirectional arrow the maximum size (512 bits; 1,024 bits; Logical Vector width=2,048 bits) of the horizontal vectors capable of being processed by memory module 100 and, by a vertical thick line the vertical transfer links activated between adjacent elementary blocks of a same column of the array. In this example, the maximum width VTW of words capable of being processed by transfer circuits 113 is considered as equal to 128 bits. The described embodiments are of course not limited to this specific case.

In FIG. 3, three distinct operating configurations (A), (B), and (C) have been shown.

In configuration (A), the vertical transfer links between the different rows are all active. In other words, each vertical transfer circuit 113 may vertically transfer data over the upward VTI-U and/or downward transfer buses VTI-D to which it is connected. In this case, the logic configuration of the array of elementary blocks coincides with its physical configuration, that is, the maximum width of the vectors that can be processed by the memory module is equal to P*VTW, that is, 4*128=512 bits in this example.

In configuration (B), the rows of the array are distributed in pairs of two adjacent rows between which the vertical transfer links are active. The vertical transfer links between two adjacent rows of different pairs are however inactive. More particularly, in the shown example, the vertical transfer links between the second and third rows of the array are deactivated. The vertical transfer links between the first and second rows and the vertical transfer links between the third and fourth rows are however active. In this case, from a logical point of view, a same horizontal vector may extend in the first and third rows, or in the second and fourth rows. Thus, the maximum width of vectors capable of being processed by the memory module is equal to 2*P*VTW, that is, 2*4*128=1,024 bits in this example.

In configuration (C), all the vertical transfer links between adjacent rows are deactivated. In this case, from a logical point of view, a same horizontal vector may extend in all the rows of the array. Thus, the maximum width of vectors capable of being processed by the memory module is equal to K*P*VTW, that is, 4*4*128=2,048 bits in this example.

Thus, the provided architecture enables to dynamically resize the width of vectors during the operation of the module according to the type of computing operations to be performed. The matching of the logic addresses and of the physical addresses is ensured by control circuit 120. At each operation, the operands and computing results remain vertically aligned.

It should be noted that the embodiments are not limited to the example of implementation of the vertical transfer circuit 113 described in relation with FIG. 2.

Further, the embodiments are not limited to the examples of uplink VTI-U and downlink VTI-D buses previously described in relation with the example of transfer circuit 113. Generally, a transfer circuit 113 enables to exchange data with other transfer circuits of the same column of elementary blocks 110 via at least one vertical bus. In the previously-described example, a series of "local" link buses are coupled via transfer circuits 113. According to an alternative embodiment, it would be possible to have a "shared" uplink bus and a "shared" downlink bus. Each elementary block 110 of a column is then coupled to each of the shared link buses via a transfer circuit 113. Each transfer circuit enables to write or to read data into or from each shared link bus according to control signals received via control bus TTC.

Figure 4A:
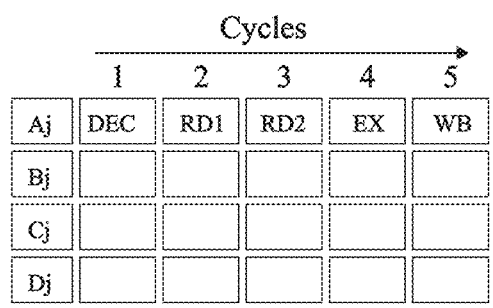
FIG. 4A illustrates an example of implementation of a computing operation by the memory module of FIG. 1.
Figure 4B:
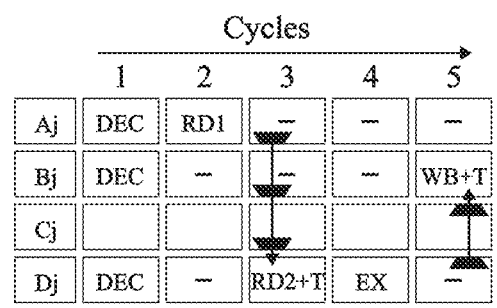
FIG. 4B illustrates another example of implementation of a computing operation by the memory module of FIG. 1.

As a variant, it is possible to provide a single link bus per elementary block column 110, the link bus then being capable of transmitting data towards the top or the bottom of the column. It is also possible to envisage a plurality of upward or downward buses per column. According to the number of shared or local link buses, the possibilities of the performing of data transfers are of course different and circuits 120 and 130 should be accordingly adapted. FIGS. 4A and 4B illustrate, as an example, the progress of a computing operation broken down into five successive elementary steps of one cycle each, that is: a step DEC of decoding of a received instruction, a step RD1 of reading of first operand data, a step RD2 of reading of second operand data, a step EX of execution of the computing operation having as operands the data read at steps RD1 and RD2, and a step WB of writing of the result of the operation.

In the example of FIG. 4A, the operand data are contained in one or a plurality of elementary blocks 110 of a same row of the array, the first row (i=0) in the shown example. The result of the computing is rewritten into these same elementary blocks 110.

The instruction is received by the corresponding memory circuit(s) 111 via bus TDI, and decoded at step DEC within these memory circuits. The rest of the operation (steps RD1, RD2, EX, and WB) is implemented within these same memory circuits 111.

In the example of FIG. 4B, the first operand data are contained in one or a plurality of elementary blocks 110 of a first row of the array (the row of rank i=0 in the shown example) and the second operand data are contained in one or a plurality of elementary blocks 110 of a second row of the array (the row of rank i=3 in the shown example), vertically aligned with the elementary blocks 110 of the first operand data. The result of operation is rewritten into one or a plurality of elementary blocks 110 of a third row of the array (the row of rank i=1 in the shown example), vertically aligned with the elementary blocks 110 of the first and second operand data.

The instruction is received by all the concerned memory circuits 111 via bus TDI, and decoded at step DEC within these memory circuits. Step RD1 is carried out in the memory circuit(s) 111 of the row of rank i=0 containing the first operand data. Step RD2 is carried out in the memory circuit(s) 111 of the row of rank i=3 containing the second operand data. In parallel with step RD2 (during the same cycle), the first operand data read at step RD1 are transferred vertically, via transfer buses VT1 and transfer circuits 113, to the corresponding elementary blocks 110 of the row containing the second operand data (the row of rank i=3 in this example). The actual computing operation (step EX) is implemented at the next cycle, within the memory circuits 111 of the row of rank i=3. At the next cycle, the result of the operation is vertically transferred towards the destination row via transfer buses VTI and transfer circuits 113, and written into the corresponding memory circuits 111 of the destination row (step WB).

The control of the vertical transfers implemented during the execution is ensured by circuit 120, via bus TTC.

Regulation circuit 130 predicts the vertical data movements between vectors according to the received instruction flow, and sends general control signals to circuit 120 in order to control the transfer circuits 113 of elementary blocks 110. In particular, regulation circuit 130 makes sure that the data are available for each step of the instruction sequence to be implemented. Risks of conflicts may particularly occur when different instructions attempt to modify a same piece of data, particularly in the following situations:

when an instruction attempts to use a result which has not been calculated yet (reading after writing);

when an instruction attempts to write a result in a destination location before the latter has been read from (writing after reading); and when an instruction attempts to write a computing result at a destination before this destination has been written into by a previous instruction (writing after writing).

To prevent such conflicts, regulation circuit 130 may in particular if necessary insert one or a plurality of waiting cycles between different steps of a same computing operation.

It should be noted that in the architecture described in relation with FIG. 1, a vertical downward data transfer and a vertical upward data transfer may be performed simultaneously (during a same cycle) in a same column of the array. However, if two instructions attempt to perform a vertical data transfer in the same direction, during a same cycle, a conflict may occur. Regulation circuit 130 may insert one or a plurality of waiting cycles between the steps of vertical transfer of the two instructions to avoid such a conflict. Similarly, regulation circuit 130 ensures that all the pending vertical transfers are performed before modifying the general virtual configuration of the array of elementary blocks such as described in relation with FIG. 3.

To drive memory module 100 from an external device, for example, a microprocessor, a dedicated set of instructions may be defined, for example, a set of instructions of the type described in patent application EP3503103A1 previously filed by the applicant.

The parameters used to reconfigure the logic arrangement of the elementary blocks 110 of module 100 may be stored in configuration register circuit 140. A specific instruction may be defined to write or read configuration parameters into or from circuit 140 from the outside of module 100, via port 123.

Figure 5:
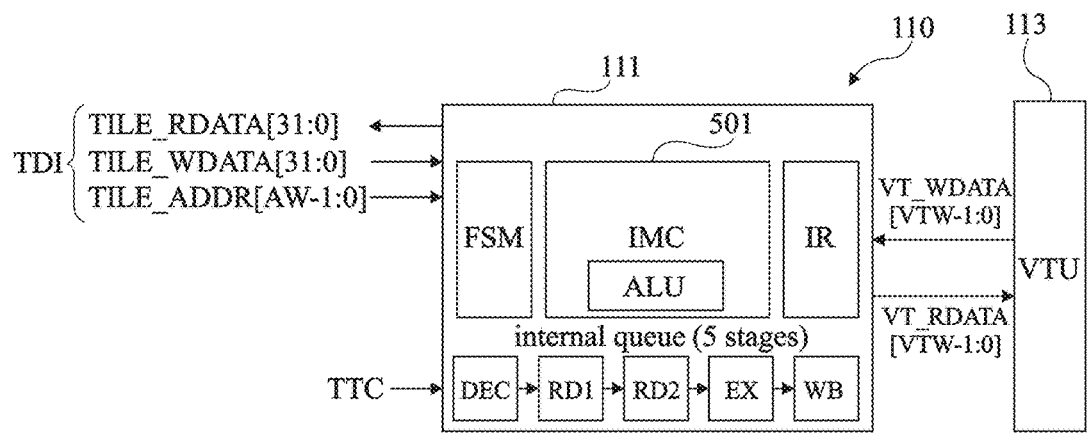
FIG. 5 shows an example of embodiment of a memory circuit of an elementary block of the memory module of FIG. 1.

FIG. 5 shows an example of embodiment of an elementary block 110 of the memory module 100 of FIG. 1. FIG. 5 more particularly details, in the form of functional blocks, an example of embodiment of the memory circuit 111 of block 110.

In this example, memory circuit 111 is a memory circuit of IMC ("In Memory Computing") type. It comprises an array 501 of elementary storage cells (not detailed in the drawing), and computing elements shown in the form of a block designated with reference ALU in FIG. 5, enabling to implement logical and/or arithmetical computing operations directly within the array of storage cells 501, for example such as described in patent application EP3252774A1 previously filed by the applicant.

The memory circuit 111 of FIG. 5 further comprises a control circuit FSM adapted to decoding and controlling the execution of read, write, and/or computing instructions received via the TDI bus.

The memory circuit 111 of FIG. 5 further comprises an internal register IR adapted to storing partial operation results, to limit accesses in read/write mode to array 501 and to avoid or limit the introduction of waiting cycles by regulation circuit 130 to manage conflicts between operations. This enables to avoid slowdowns of the processor and to keep an optimal instruction flow rate.

In this example, memory circuit 111 comprises, connected to bus TDI, a signal input-output port, particularly comprising:

a data output port TILE_RDATA;
a data input port TILE_WDATA; and
an address signal input port TILE_ADDR.

In the shown example, ports TILE_RDATA and TILE_WDATA each have a 32-bit width. The described embodiments are of course not limited to this specific case. As an example, the width of ports TILE_RDATA and TILE_WDATA is smaller than or equal, and preferably smaller, than the width VTW (128 bits in the example of FIG. 3) of ports VT_RDATA and VT_WDATA connected to the vertical transfer circuit 113 of block 110. The advantage of having data exchange link buses VTI having a large width VTW, greater than the width of the data buses forming part of bus TDI having a width corresponding to the size of ports TILE_RDATA and TILE_WDATA, is to allow a fast vertical transfer between two memory circuits of different elementary blocks. The presence of one of these "direct" link buses enables to transfer at once, during a cycle, the totality of an operand stored in a memory circuit when width VTW corresponds to the width of the operand. In the absence of this "wide" link bus dedicated to the transfer of operands, the only way to transfer an operand would be to use bus TDI, of smaller width, and the operand would have in practice to be divided into a plurality of pieces and the transfer would take a plurality of cycles. Thus, as compared with conventional systems where independent memories are coupled by system buses often of small size, the gathering of the memory circuits into an array such as in the invention enables to optimize the data transfer between memories.

The input-output port connected to bus TDI may further comprise additional input terminals adapted to receiving control and/or clock signals.

Memory circuit 111 may further comprise input terminals, not detailed in the drawing, connected to bus TTC. The signals received from bus TTC enable in practice to control on the one hand the data transfer via transfer circuit 113, such as previously described, and on the other hand to control computing operations in memory circuit 111. The signals of bus TTC reaching a memory circuit are for example the signals TILE_NMC_CTRL shown in FIG. 10. These signals enable to configure the memory circuit in a "conventional" or "computing" mode. The conventional operating mode of the memory circuit corresponding to the conventional data read/write operations in the memory based on the conventional control signals received over the TDI bus. The "computing" (often called "smart memory") mode corresponds to the activation of computing functionalities in memory circuit 111. For this purpose, a state machine FSM is for example used to control the execution of the operations particularly the content of a set of latches "queue" (described hereabove) and the use of internal register IR, as well as any internal and/or peripheral computing functions of memory block 501/ALU. In computing mode, the information concerning the type of instructions, the operands are transmitted in this example via bus TDI and interpreted during the instruction decoding operation.

In the shown example, memory circuit 111 further comprises a series of memory latches adapted to timing/sequencing a sequence of operations to be executed. In the shown example, this sequence of latches, also called queue (internal queue (5 stages)), separates the sequence of operations into five stages corresponding for example to the five successive steps DEC, RD1, RD2, EX, and WB described in relation with FIGS. 4A and 4B.

It should be noted that the described embodiments are not limited to the case where memory circuit 111 is a circuit of IMC type. More generally, the described embodiments may be adapted to any types of memory circuits adapted to implementing computing operations, for example, circuits of NMC ("Near Memory Computing") type, where computing circuits are integrated at the immediate periphery of the array of elementary cells of the memory circuit. Examples of NMC-type circuits are described in French patent application 2001243.

The memory module 100 of FIG. 1 may be integrated in a standard system (not shown) comprising a processor, for example, similarly to what has been described in the above mentioned patent application EP3503103A1.

As an example, memory module 100 may be integrated in a system of low latency (not shown), directly coupled, for example connected, to the processor, and operate at the processor frequency. The processor for example executes its own instructions originating from an instruction memory of the system. Module 100 may receive instructions and data directly from the processor, or from a system bus connected to the processor. Similarly, module 100 may send data directly to the processor, or over the system bus.

Figure 6:
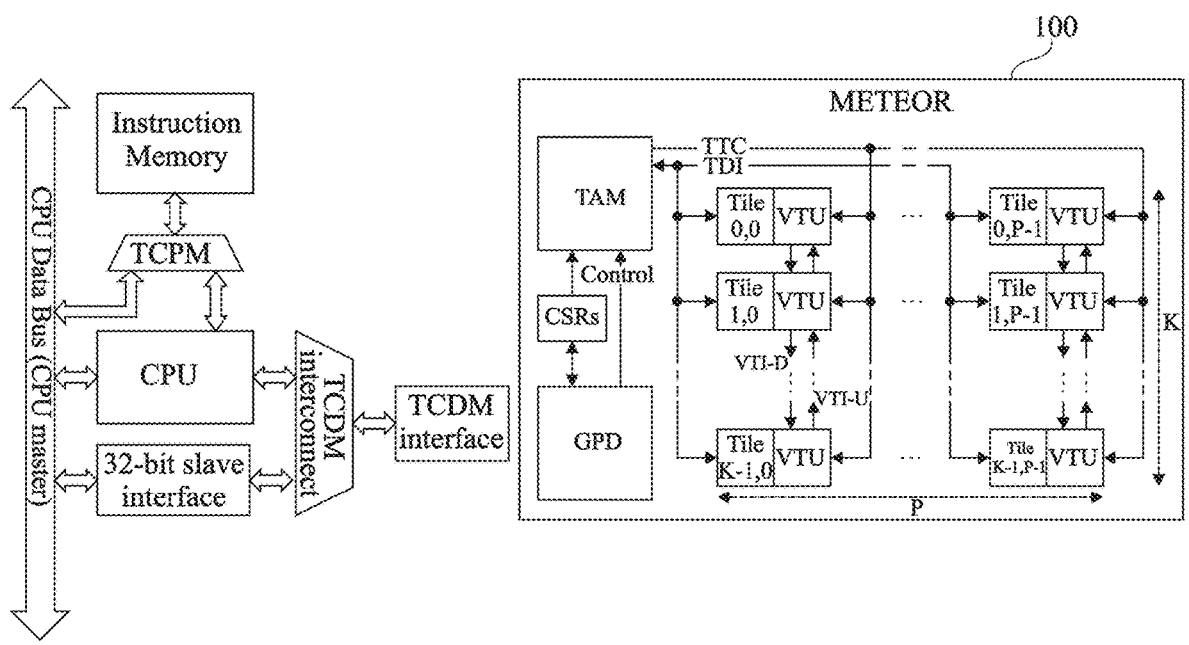
FIG. 6 illustrates an example of a system comprising a memory module of the type described in relation with FIG. 1.

FIG. 6 shows an example of embodiment of such a system. In this example, memory module 100 is also designated with reference METEOR. The ports 123 and 131 of the memory module, not detailed in FIG. 6, are connected to an external interface circuit designated with reference "TCDM interface", itself coupled, via an interconnection multiplexer designated with reference "TCDM interconnect", to a processor CPU. Processor CPU is connected to a master bus designated with reference "CPU Data Bus (CPU master)". The interconnection multiplexer further couples a slave interface circuit, for example, a 32-bit interface circuit, designated in the drawing with reference "32 bit slave interface", to interface circuit "TCDM interface". The slave interface circuit is connected to the master bus. Processor CPU is further coupled, via a multiplexer TCPM, to an instruction memory designated with reference "Instruction Memory". Multiplexer TCPM further couples the master bus to the instruction memory.

As a variant, the memory module 100 of FIG. 1 may be integrated in a distributed system (not shown) as a co-processing unit connected to the system bus and operating in parallel with the processor, at a frequency distinct from that of the processor. The system may in particular comprise one or a plurality of hardware accelerators connected to the system bus and each comprising a single module 100, or a plurality of modules 100 coupled to a same local bus enabling to implement distributed computing operations.

Figure 7:
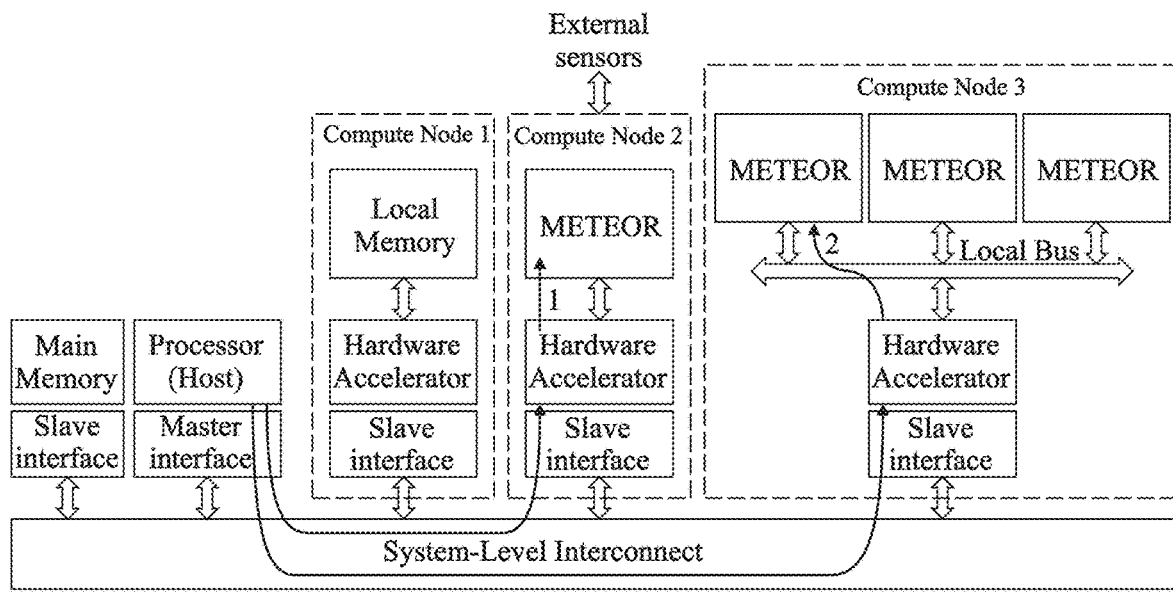
FIG. 7 illustrates another example of a system comprising memory modules of the type described in relation with FIG. 1.

FIG. 7 shows an example of embodiment of such a system. The system of FIG. 7 comprises a host processor designated with reference "Processor (Host)" and coupled, via a master interface circuit designated with reference "Master interface", to a system bus designated with reference "System Level Interconnect". The system further comprises a main memory designated with reference "Main Memory", coupled to the system bus by a slave interface circuit designated with reference "Slave interface". In the shown example, the system comprises first, second, and third computing nodes respectively designated with references "Compute Node 1", "Compute Node 2", and "Compute Node 3". The first computing node comprises a local memory designated with reference "Local Memory", coupled to a hardware acceleration circuit designated with reference "Hardware Accelerator". The first calculation node further comprises a slave interface circuit "Slave interface" coupling the hardware acceleration circuit to the system bus. The second computing node is similar to the first computing node, but for the fact that the local memory is replaced with a memory module METEOR of the type described in relation with FIG. 1. The second computing node may further be coupled to external sensors, not detailed, designated with reference "External sensors". The third computing node is similar to the second node, but for the fact that it comprises not a single but a plurality (three in the shown example) of memory modules METEOR of the type described in relation with FIG. 1. Memory modules METEOR are coupled to the hardware acceleration circuit via a local bus, designated with reference "Local Bus". In each of the second and third computing nodes, the processor is adapted to controlling, via the hardware acceleration circuit of the node, the execution of computing operations in the memory modules METEOR of the node.

Figure 8:
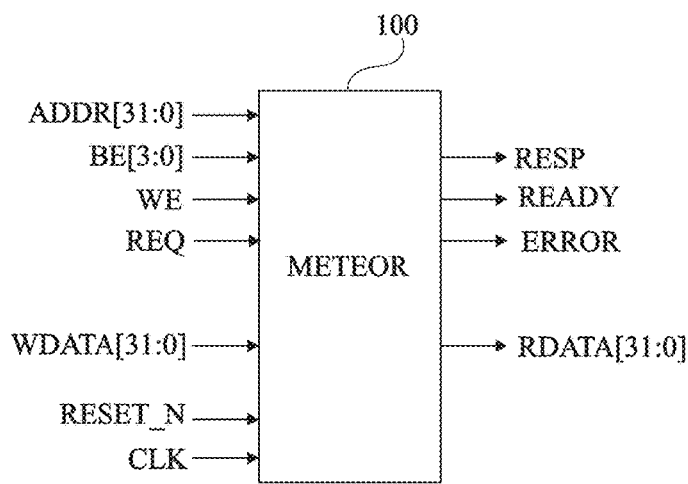
FIG. 8 illustrates an example of implementation of the external interfaces between a memory module of the type described in relation with FIG. 1 and external circuits.

FIG. 8 illustrates an example of implementation of the external interfaces of a memory module 100 (METEOR) of the type described with FIG. 1, corresponding to the input/output ports 123 and 131 of FIG. 1. These interfaces may correspond to the interfaces of a standard memory circuit and enable to couple the memory to other "master" components, for example, via a bus, as a slave memory. In the shown example, the external interfaces of memory module 100 comprise:
- address and control inputs comprising one address input port ADDR (32 bits in the shown example), and three control input ports BE (4 bits in this example), WE (1-bit in this example) and REQ (1 bit in this example) corresponding to conventional signals respectively indicating the size of the masked data, the desired read/write operation and of memory access request by a master component;
- a data input comprising a data input port WDATA (32 bits in the shown example);
- general control signal inputs comprising a node of application of a reset signal RESET N and a node of application of a clock signal CLK;
- control outputs comprising three nodes for delivering control signals RESP, READY, and ERROR; and
- a data output comprising a data output port RDATA (32 bits in the shown example).

The master may deliver address, data, and control information to initiate read and write operations. The slave may deliver a status of the transfer to the master (signal RESP), a signal when the transfer has ended (READY), and an error signal (ERROR). Instructions specific to the implementation of computing operations may be encapsulated in input signals ADDR and WDATA. An example of a slave memory circuit capable of decoding instructions sent by a processor is described in French patent application 1762468.

Figure 9:
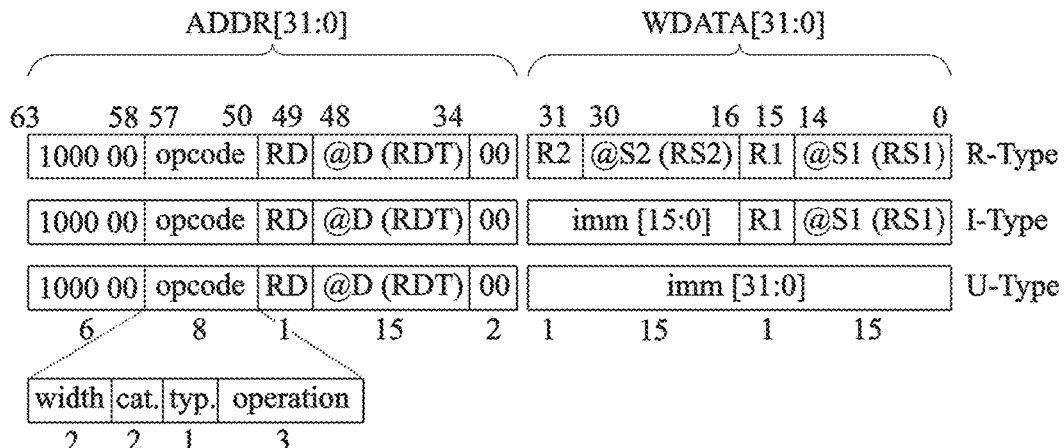
FIG. 9 illustrates an example of instruction format capable of being used to communicate between an external circuit and a memory module of the type described in relation with FIG. 1.

FIG. 9 illustrates an example of instruction format capable of being used to communicate between an external circuit, for example, a processor, and a memory module of the type described in relation with FIG. 1. Regarding the execution, sending a computing instruction to the memory module is equivalent to writing specific data at a specific address in a virtual memory.

There have been shown in FIG. 9 three types of instructions:
- R-type instructions (designated with reference "R-Type" in the drawing) where the computing operands to be performed are located in two distinct rows of the memory module;
- I-type instructions (designated with reference "I Type" in the drawing) which apply between an immediate 16-bit operand value and a single row of the memory; and
- U-type instructions (designated with reference "U Type" in the drawing) which contain a single immediate 32-bit operand value applicable to a memory row.

In this example, each instruction requires a total of at least 56 bits and is transmitted in one cycle via buses ADDR and WDATA. Each instruction contains, on bus ADDR, a field "opcode" (including for example width "width", category "cat.", type "typ.", and operation "operation" fields) defining the operation to be performed, and a field "@D (RDT)" containing the destination address of the result of the operation. In R-type instructions, each instruction further contains, on bus WDATA, a field "@S1 (RS1)" containing the address of the first operand R1 of the operation, and a field "@S2 (RS2)" containing the address of the second operand R2 of the operation. In I-type instructions, each instruction further contains, on bus WDATA, a 16-bit field "imm" containing an immediate operand value of the operation, and a field "@S1 (RS1)" containing the address of the second operand of the operation. In U-type instructions, each instruction contains, on bus WDATA, a 32-bit field "imm" containing an immediate operand value.

Figure 10:
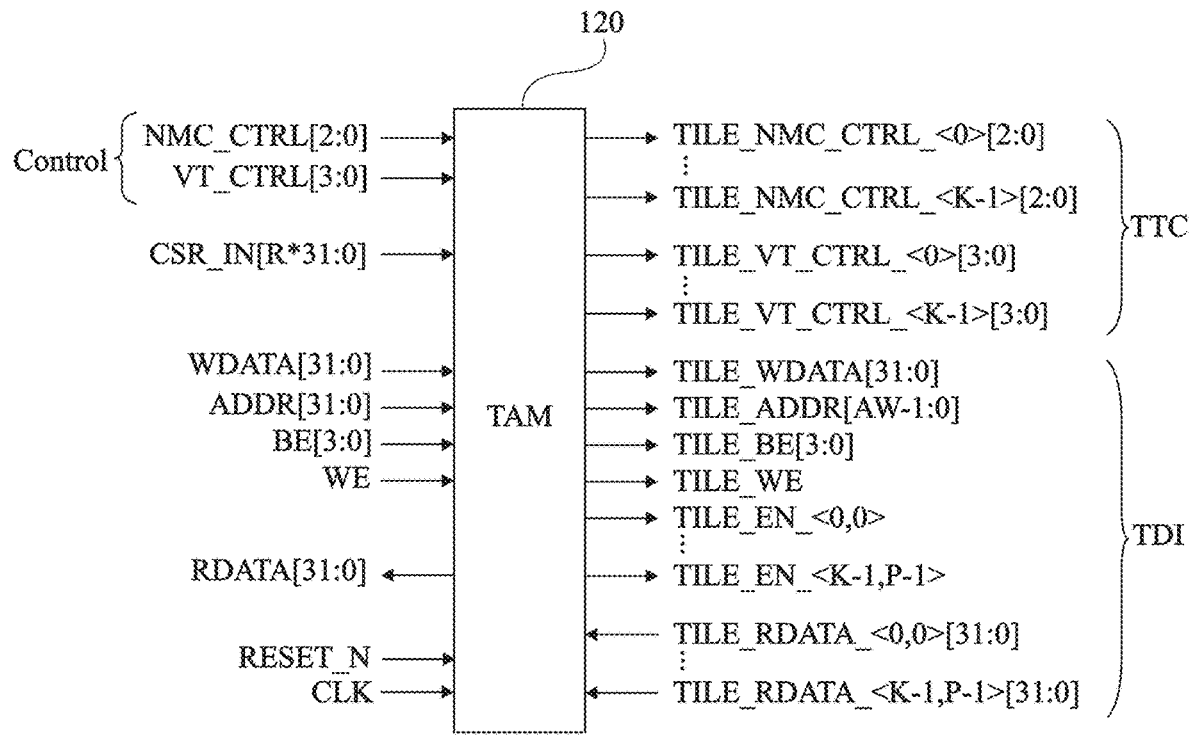
FIG. 10 details an example of implementation of the interfaces of a control circuit of the memory module of FIG. 1.

FIG. 10 details an example of implementation of the interfaces of the control circuit 120 (TAM) of the memory module of FIG. 1.

In this example, circuit 120 is connected to the above-described ports WDATA, ADDR, BE, WE, RDATA, RESET N, and CLK.

In the shown example, circuit 120 comprises an input port CSR_IN connected to register circuit 140. As an example, port CSR_IN is a port of R*32 bits, where R designates the number of configuration registers of circuit 140.

Circuit 120 further comprises a control input port NMC_CTRL (3 bits in this example) connected to bus Control (FIG. 1) and adapted to receiving from regulation circuit 130 signals for controlling the computing operations to be implemented in the memory module, and a control input port VT_CTRL (4 bits in this example) adapted to receiving from regulation circuit 130 signals for controlling the configuration of the transfer circuits 113 of the memory module.

The circuit 120 of FIG. 10 further comprises, connected to bus TTC:
K control output ports TILE_NMC_CTRL_<i> (3 bits each in this example) intended to deliver signals for controlling the computing operations to be implemented respectively in the K rows of the memory module; and
K control output ports TILE_VT_CTRL_<i> (4 bits each in this example) intended to deliver signals for controlling the vertical transfer circuits 113 respectively in the K rows of the memory module.

The circuit 120 of FIG. 10 further comprises, connected to bus TDI:
a data output port TILE_WDATA (32 bits in this example) connected to the corresponding data input port of the elementary blocks 110 of the memory module;
an address output port TILE_ADDR connected to the corresponding address input port of each of the elementary blocks 110 of the memory module;
a control output port TILE_BE (4 bits in this example) connected to a corresponding control input port of each of the elementary blocks 110 of memory module;
a control output port TILE_WE (1 bit in this example) connected to a corresponding control input port of each of the elementary blocks 110 of the memory module;
K*P activation output ports TILE_EN<i,j> (1 bit each in this example) respectively connected to corresponding activation input ports of the K*P elementary blocks 110 of the memory module; and
K*P data input ports TILE_RDATA<i,j> (32 bit each in this example) respectively connected to the corresponding data output ports of the K*P elementary blocks 110 of the memory module.

In this example, circuit 120 may operate in three modes. The first mode is a standard read mode. Circuit 120 then generates the target address (TILE_ADDR) and selects the corresponding block 110 (TILE_EN) via bus TDI. At the next cycle, the read piece of data is returned (TILE_RDATA) via bus TDI and then through a multiplexer to port RDATA. The second mode is a standard write mode. This mode is similar to the read mode, with the difference that the data to be written are received via port WDATA. This operation also takes one clock cycle.

The third mode is a sending of computing instructions to the elementary blocks 110 of the memory module. When the instruction is received by circuit 120, the absolute source and destination addresses contained in portions WDATA and ADDR are transcribed into vector addresses, and the instruction is transmitted to all the blocks 110 containing the elements of the vectors concerned by the operation, via bus TDI. Within the same cycle, regulation circuit 130 detects possible address conflicts and sends the corresponding control signals (NMC_CTRL, VT_CTRL) to circuit 120, which distributes them via bus TTC after adaptation, particularly to take into account the addressing of the concerned elementary blocks.

Figure 11:
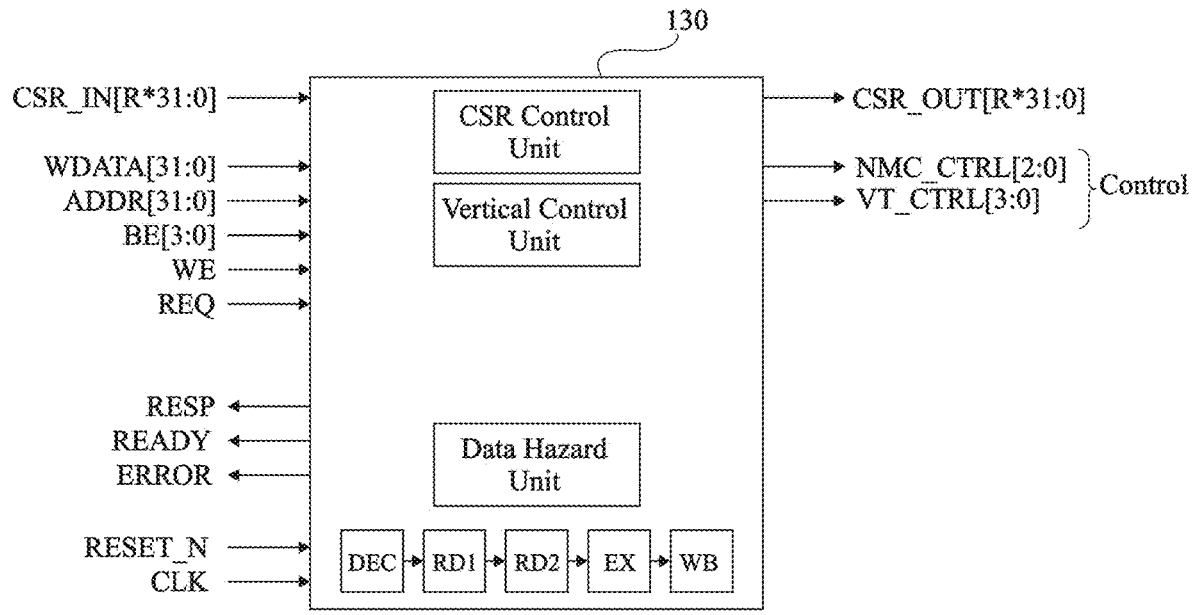
FIG. 11 details an example of implementation of a regulation circuit of the memory module of FIG. 1.

FIG. 11 details an example of implementation of the regulation circuit 130 of the memory module of FIG. 1. In this example, circuit 130 comprises a circuit designated with reference "Data Hazard Unit" which verifies possible conflicts between instructions, a circuit designated with reference "Vertical Control Unit" which verifies possible vertical data transfer conflicts, and a circuit designated with reference "CSR Control Unit" which manages configuration registers 140 for the general configuration of the array of elementary blocks 110. Circuit 130 replicates the complete flow of pipelines instructions of the memory and puts the master processor on hold when this is necessary.

Figure 12:
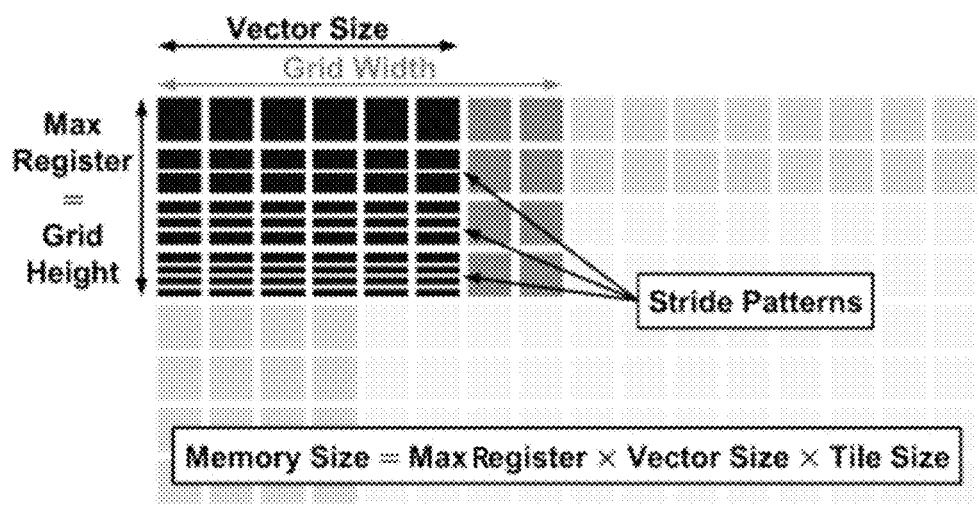
FIG. 12 details an example of operation of a configuration register circuit of the memory module of FIG. 1.

FIG. 12 illustrates an example of operation of the configuration register circuit 140 of the memory module of FIG. 1.

To reconfigure the array of elementary blocks 110 of the memory module, parameters of circuit 140 are updated. These parameters may be updated or read during the execution of a program by a processor coupled to module 100 by for example using a specific instruction of the type described hereabove (FIG. 9, with a specific instruction capable of including a specific opcode). This specific instruction will enable to configure different parameters. For example, as illustrated in FIG. 12, the parameters "Grid Width" and "Grid Height" of circuit 140 define the dimensions of a rectangle of elementary blocks 110 used to implement computing operations. Parameter "Vector Size" enables to define vectors of dimensions smaller than or equal to the width of the rectangle, to be able, if need be, to save energy, at the cost of a decrease of the size of the virtually available memory (parameter "Memory Size"). Parameter "Stride Patterns" enables to write or to read data vectors with an interlacing. Parameter "Max Register" defines the maximum number of internal registers IR available in elementary blocks 110 and usable for calculation operations asked from the memory module. Parameter "Memory Size" is equal to the product of parameters "Max Register", "Vector Size", and "Tile_Size" ("Memory Size"="Max Register" x "Vector Size" x "Tile_Size"), with Tile_Size representing the memory circuit size.

It should be noted that in the previously-described examples, a specific instruction is used to define the vector sizes used. As a variant, it is possible to specify the size of the vectors, or more generally, the local arrangement of the elementary blocks 110 of module 100, in each sent instruction. For this purpose, each instruction may contain a configuration field. In this case, configuration register 140 may be omitted.

However, to facilitate the implementation of the general control by block TAM 120, it is simpler to have a dedicated instruction, which further avoids increasing the number of bits necessary to code the instruction.

Many computing applications may take advantage of a reconfigurable memory module of the type disclosed in relation with FIG. 1. Examples of applications will be described hereafter. The described embodiments are of course not limited to these examples.

A first example of application capable of taking advantage of a reconfigurable memory module of the type disclosed in relation with FIG. 1 is an application of search for a predefined pattern in a sequence of values, for example, a DNA sequence. For this purpose, a method called shift-or may be used, for example such as described in the article entitled "The Exact Online String Matching Problem: a Review of the Most Recent Results", of Simone Faro and Thierry Lecroq. As an example, a section of the studied DNA sequence may be loaded into a first horizontal vector of dimension N. A set of M masks of dimension N corresponding to the pattern to be searched for is further loaded into M other horizontal vectors of dimensions N vertically aligned with the first vector. A vertical word to word comparison is implemented between the first vector and each of the masks. The algorithm is then repeated for each of the next sections of the DNA sequence. The larger the dimension of the horizontal vectors, the faster the search will be. A configuration such that configuration (C) of FIG. 3 may for example be preferred for this application.

A second example of application capable of taking advantage of a memory module of the type disclosed in relation with FIG. 1 is the implementation of an algorithm of fully connected kernel type. This type of algorithm may in particular be used in the final layers of a classification algorithm based on neural networks. A relatively small quantity of memory may be used to store the input data, and a relatively high quantity of memory may be used to store the weight data or weighting data. The input data may for example be loaded into a first horizontal vector, and the weighting coefficients may be loaded into a plurality of horizontal vectors vertically aligned with the vector containing the input data. Thus, the input data may be multiplied by a large number of weighting coefficients. The algorithm may further calculate the sum of each vector resulting from the multiplication of the input data vector by a weight vector (weighted sum). During the computing, the input data may be displaced vertically towards each weight vector, via vertical transfer circuits 113, to perform the multiplication operations in the elementary blocks 110 storing the weight vectors. This enables to avoid having to replicate the input data in each row of elementary blocks 110 of the memory module, thus decreasing the total quantity of memory necessary for the execution of the algorithm.

A third example of application capable of taking advantage of a memory module of the type disclosed in relation with FIG. 1 is the implementation of an algorithm using shared interlaced data, for example, a convolutional kernel used in the main layers of a convolutional neural network, using a relatively large quantity of memory to store the input data and a relatively small quantity of memory to store the weight data. The weight data may for example be stored in some of the rows of elementary blocks 110 of the memory module, and the input data distributed in all the elementary blocks 110. The vertical transfers, via transfer circuits 113, enable to displace upwards or downwards the weight data in the blocks containing the input data, to perform the computing operations. Thus, the weight data may be shared by the different rows of elementary blocks, decreasing the total quantity of memory necessary to the execution of the algorithm.

A fourth example of application capable of taking advantage of a memory module of the type disclosed in relation with FIG. 1 is the implementation of reduction operations. Such operations are for example used in algorithms of BLAS ("Basic Linear Algebra Subprograms") type implementing a same operation between all the elements forming a vector. When the vectors are of larger dimensions, the implementation of such an operation with a scalar processor is proportional to the size of the vectors. The reconfigurability of the memory module enables to increase the size of the horizontal vectors available to perform computing operations, and thus to significantly decrease the number of cycles required to implement such operations.

Various embodiments and variants have been described. Those skilled in the art will understand that certain features of these various embodiments and variants may be combined, and other variants will occur to those skilled in the art. In particular, the described embodiments are not limited to the examples of numerical values mentioned in the present disclosure.

Further, those skilled in the art can refer to the documents listed hereafter to obtain a broader description of the notions and acronyms used in the present disclosure.

REFERENCES

[1] Multi layer AHB Technical Overview v2.0, 2006. URL: https://developer.arm.com/docs/dvi0045/b/multi-layer-ahb-technical-overview-v20.

[2] AMBA 3 AHB Lite Protocol Specification v1.0, March 2010. URL: https://developer.arm.com/docs/ihi0033/a/amba-3-ahb-lite-protocol-specification-v10.

[3] A. Agrawal, A. Jaiswal, C. Lee, and K. Roy. X SRAM: Enabling in memory boolean computations in CMOS static random access memories. IEEE Transactions on Circuits and Systems I: Regular Papers, 2018. doi: 10.1109/TCSI.2018.2848999.

[4] K. C. Akyel, H. P. Charles, J. Mottin, B. Giraud, G. Suraci, S. Thuries, and J. P. Noel. DRC2: Dynamically Reconfigurable Computing Circuit based on memory architecture. In IEEE International Conference on Rebooting Computing (ICRC), 2016. doi:10.1109/ICRC.2016.7738698.

[5] C. Eckert, X. Wang, J. Wang, A. Subramaniyan, R. Iyer, D. Sylvester, D. Blaaauw, and R. Das. Neural Cache: Bit Serial In Cache Acceleration of Deep Neural Networks. In ACM/IEEE International Symposium on Computer Architecture (ISCA), 2018. doi:10.1109/ISCA.2018.00040.

[6] S. Faro and T. Lecroq. The exact online string matching problem: a review of the most recent results. ACM Computing Surveys (CSUR), 2013. doi:10.1145/2431211.2431212.

[7] R. Gauchi, M. Kooli, P. Vivet, J. P. Noel, E. Beingé, S. Mitra, and H. P. Charles. Memory sizing of a scalable sram in memory computing tile based architecture. In IFIP/IEEE International Conference on Very Large Scale Integration and System on Chip designs (VLSI SoC), 2019. doi:10.1109/VLSI-SoC.2019.8920373.

[8] J. Wang, X. Wang, C. Eckert, A. Subramaniyan, R. Das, D. Blaaauw, and D. Sylvester. A Compute SRAM with Bit Serial Integer/Floating Point Operations for Programmable In Memory Vector Acceleration. In IEEE International Solid State Circuits Conference (ISSCC), 2019. doi:10.1109/ISSCC.2019.8662419.

[9] M. Kooli, H. Charles, C. Touzet, B. Giraud, and J. Noel. Smart instruction codes for in memory computing architectures compatible with standard SRAM interfaces. In Design, Automation & Test in Europe Conference & Exhibition (DATE), 2018. doi:10.23919/DATE.2018.8342276.

[10] J. P. Noel, V. Eglo_, M. Kooli, R. Gauchi, J. M. Portal, H. P. Charles, P. Vivet, and B. Giraud. Computational SRAM Design Automation using Pushed Rule Bitcells for Energy-Efficient Vector Processing. In Design, Automation & Test in Europe Conference & Exhibition (DATE), 2020.

[11] W. A. Simon, Y. M. Qureshi, A. Levisse, M. Zapater, and D. Atienza. BLADE: A BitLine Accelerator for Devices on the Edge. Proceedings of the ACM Great Lakes Symposium on VLSI (GLSVLSI), 2019. doi: 10.1145/3299874.3317979.

[12] G. Singh, L. Chelini, S. Corda, A. Javed Awan, S. Stuijk, R. Jordans, H. Corporaal, and A. Boonstra. A Review of Near Memory Computing Architectures:

Opportunities and Challenges. In Euromicro Conference on Digital System Design (DSD), 2018. doi:10.1109/DSD.2018.00106.

[13] N. Stephens, S. Biles, M. Boettcher, J. Eapen, M. Eyole, G. Gabrielli, M. Horsnell, G. Magklis, A. Martinez, N. Premillieu, A. Reid, A. Rico, and P. Walker. The ARM Scalable Vector Extension. IEEE Micro, 2017. doi: 10.1109/MM.2017.35.

[14] A. Traber, M. Gautschi, and P. D. Schiavone. RI5CY: User Manual, 2019. URL: https://www.pulp-platform.org/docs/ri5cy_user_manual.pdf.

Finally, the practical implementation of the described embodiments and variations is within the abilities of those skilled in the art based on the functional indications given hereabove. In particular, the forming of the different functional elements of the memory module of FIG. 1 are within the abilities of those skilled in the art based on the indications of the present disclosure.

What is claimed is:

1. Memory module adapted to implementing computing operations, the module comprising a plurality of elementary blocks arranged in an array according to rows and columns, wherein:

each elementary block comprises a memory circuit adapted to implementing computing operations, and a configurable transfer circuit, the memory circuit comprising an array of elementary storage cells, and circuits adapted to implementing computing operations within or at the periphery of the array of elementary storage cells;

in each column of the array, the configurable transfer circuits of the elementary blocks in the column are coupled by at least one link bus;

each configurable transfer circuit is parameterizable to transmit data originating from a first transmit elementary block to a receive elementary block of a same column of elementary blocks via said at least one link bus;

an internal control circuit is connected to an input-output port of the module comprising a data input port, a data output port, and an address input port, the input-output port of the module being intended to be connected to an external device; and the internal control circuit is configured to read at least one instruction signal on the input-output port of the module and accordingly parameterize the configuration of the configurable transfer circuits, at least one instruction signal enabling to define the size of the operand vectors of the computing operations implemented by the memory module, wherein at least one instruction signal capable of being received on the input-output port of the memory module codes an operation to be performed between 2 operands stored in different memory circuits respectively belonging to at least one first elementary block and at least one second elementary block, and for which the execution of the operation comprises an operation of transfer of one of the operands from said at least one first elementary block to said at least one second elementary block via the configurable transfer circuits of said at least one first and at least one second elementary blocks and said at least one link bus.

2. Memory module according to claim 1, further comprising a configuration register storing information relative to the current size of the operand vectors, the configuration register being updated after reception of a size configuration instruction signal originating from said external device.

3. Memory module according to claim 2, comprising a plurality of elementary blocks arranged in an array according to K rows and P columns, with P an integer greater than or equal to 1, and K an integer greater than 1, and wherein the size of the operand vectors may take a plurality of different values including at least one first size smaller than a second size, and wherein, when the first size is applied, an operand is stored in the memory circuits of a single row of elementary blocks and wherein when the second size is applied an operand is stored in the memory circuits of a plurality of rows of elementary blocks, each memory circuit comprising a portion of the operand of second size and wherein a single vector size is applied at a given time and defined by the configuration register.

4. Memory module according to claim 3, wherein, when the second size is applied, a first operand is stored in a plurality of first elementary blocks belonging to different rows and a second operand is stored in a plurality of second elementary blocks belonging to different rows, et and wherein the operation of transfer of the first operand comprises a plurality of independent operations of transfer from a first elementary block to a second elementary block.

5. Memory module according to claim 3, wherein when the second size is applied, the array of elementary blocks is organized in a plurality of groups of rows, each group of rows being used to store a same portion of a given operand, and wherein data transfers between two elementary blocks of a same column are possible only within a same group of rows.

6. Memory module according to claim 1, wherein:

in each column of the array, the configurable transfer circuits of the elementary blocks in the column are coupled by uplink and downlink buses;

each configurable transfer circuit is controllable to transmit data between two uplink buses, between two downlink buses, and/or between the memory circuit of the corresponding elementary block and the two uplink buses and/or the two downlink buses.

7. Memory module according to claim 6, wherein:

in each column of the array, the configurable transfer circuits of any two adjacent elementary blocks of the column are coupled two by two by an uplink bus and by a downlink bus;

in each elementary block of each column of the array, except for the elementary blocks of the first and last rows of the array, the configurable transfer circuit of the elementary block is controllable to:

a) transmitting on a first data input port of the memory circuit of the elementary block one or the other of:
a data word received over the downlink bus coupling the elementary block to the adjacent elementary block of lower rank in the column; and
a data word received over the uplink bus coupling the elementary block to the adjacent elementary block of higher rank in the column;

b) transmit over the uplink bus coupling the elementary block to the adjacent elementary block of lower rank in the column one or the other of:
a data word received on a first data output port of the memory circuit of the elementary block; and
a data word received over the downlink bus coupling the elementary block to the adjacent elementary block of higher rank in the column; and c) transmit over the downlink bus coupling the elementary block to the adjacent elementary block of higher rank in the column one or the other of:

a data word received on the first data output port of the memory circuit of the elementary block; and a data word received over the downlink bus coupling the elementary block to the adjacent elementary block of lower rank in the column.

8. Memory module according to claim 1, wherein the transfer circuits of the different elementary blocks of the array are connected to the internal control circuit of the memory module via a control bus.

9. Memory module according to claim 1, wherein the memory circuits of the different elementary blocks of the array are connected to the internal control circuit via a distribution bus.

10. Memory module according to claim 9, wherein each memory circuit comprises a second data input port and a second data output port connected to the distribution bus.

11. Memory module according to claim 10, wherein the width of the second data input port and the width of the second data output port are respectively smaller than or equal to the width of the first data input port and the width of the first data output port.

12. Memory module according to claim 11, wherein the width of the second data input port and the width of the second data output port are respectively smaller than the width of the first data input port and than the width of the first data output port.

13. Memory module according to claim 9, wherein each memory circuit further comprises an address input port connected to the distribution bus.

14. Memory module according to claim 1, further comprising a general access regulation circuit, connected to the internal control circuit, the general access regulation circuit performing a tracking of the instructions received on the input-output port of the module and asking if necessary the internal control circuit to wait before requiring the execution of an instruction by an elementary block or before performing a data transfer between a plurality of elementary blocks via said at least one link bus.

15. Memory module according to claim 7, wherein, in each elementary block, the transfer circuit of the block comprises first, second, and third multiplexers each having first and second input ports and an output port and wherein:

the first multiplexer has its first and second input ports respectively connected to the downlink bus coupling the elementary block to the adjacent elementary block of lower rank in the column and to the uplink bus coupling the elementary block to the adjacent elementary block of higher rank in the column, and its output port connected to the first data input port of the memory circuit of the elementary block;

the second multiplexer has its first and second input ports respectively connected to the first data output port of the memory circuit of the elementary block and to the uplink bus coupling the elementary block to the adjacent elementary block of higher rank in the column, and its output port connected to the uplink bus coupling the elementary block to the adjacent elementary block of lower rank in the column; and the third multiplexer has its first and second input ports respectively connected to the first data output port of the memory circuit of the elementary block and to the downlink bus coupling the elementary block to the adjacent elementary block of lower rank in the column, and its output port connected to the downlink bus coupling the elementary block to the adjacent elementary block of higher rank in the column.

16. Memory module according to claim 1, wherein said instruction is transmitted via the data input port and the address input port of the input-output port of the memory module.

17. Memory module according to claim 1, adapted to implementing computing operations between 2 operands stored in a same memory circuit of an elementary block.

18. System comprising a memory module according to claim 1, and a processing unit coupled to the memory module via the input-output port of the memory module, the memory module being coupled to a bus and behaving as a slave component over said bus.

* * * * *